(12) United States Patent
Lee

(10) Patent No.: US 9,349,930 B2
(45) Date of Patent: May 24, 2016

(54) LED MODULE AND LIGHTING ASSEMBLY

(76) Inventor: Chung Hoon Lee, Ansan-si (KR)

( * ) Notice: Subject to any disclaimer, the term of this patent is extended or adjusted under 35 U.S.C. 154(b) by 46 days.

(21) Appl. No.: 13/981,821

(22) PCT Filed: Jan. 17, 2012

(86) PCT No.: PCT/KR2012/000381
§ 371 (c)(1),
(2), (4) Date: Jul. 25, 2013

(87) PCT Pub. No.: WO2012/128458
PCT Pub. Date: Sep. 27, 2012

(65) Prior Publication Data
US 2013/0307016 A1    Nov. 21, 2013

(30) Foreign Application Priority Data
Jan. 26, 2011    (KR) .......................... 10-2011-0007582

(51) Int. Cl.
| | |
|---|---|
| H01L 33/00 | (2010.01) |
| H01L 33/64 | (2010.01) |
| F21V 23/00 | (2015.01) |
| H05K 1/02 | (2006.01) |
| F21K 99/00 | (2016.01) |

(Continued)

(52) U.S. Cl.
CPC . *H01L 33/64* (2013.01); *F21K 9/17* (2013.01); *F21V 23/005* (2013.01); *F21V 29/15* (2015.01); *H05K 1/0201* (2013.01); *F21V 29/74* (2015.01); *F21Y 2101/02* (2013.01); *H01L 2924/0002* (2013.01); *H05K 2201/10106* (2013.01); *H05K 2201/10575* (2013.01)

(58) Field of Classification Search
CPC ....................................................... H01L 33/64
USPC ............................................................ 257/99
See application file for complete search history.

(56) References Cited

U.S. PATENT DOCUMENTS

| | | | |
|---|---|---|---|
| 2005/0068776 | A1 | 3/2005 | Ge |
| 2006/0268527 | A1 | 11/2006 | Tanaka et al. |

(Continued)

FOREIGN PATENT DOCUMENTS

| | | |
|---|---|---|
| CN | 101541114 | 9/2009 |
| CN | 201306688 | 9/2009 |

(Continued)

OTHER PUBLICATIONS

International Search Report issued on Sep. 7, 2012 in International Patent Application No. PCT/KR2012/000381.

(Continued)

*Primary Examiner* — Douglas Menz
(74) *Attorney, Agent, or Firm* — H.C. Park & Associates, PLC

(57) ABSTRACT

Disclosed are a light emitting diode (LED) module and a lighting assembly. The lighting assembly comprises a light emitting device, a driver integrated circuit device for driving the light emitting device, a heat sink for dissipating heat generated from the light emitting device, and a heat shielding portion for blocking thermal interference between the driver integrated circuit device and the light emitting device. In the LED module, the driver integrated circuit device is disposed on the heat shielding portion. Accordingly, it is possible to block thermal interference between the light emitting device and the driver integrated circuit device and to decrease the size of the lighting assembly.

18 Claims, 1 Drawing Sheet

(51) Int. Cl.
*F21V 29/15* (2015.01)
*F21Y 101/02* (2006.01)
*F21V 29/74* (2015.01)

(56) References Cited

U.S. PATENT DOCUMENTS

2007/0081342 A1 4/2007 Szeto
2009/0272987 A1 11/2009 Wang
2009/0296413 A1 12/2009 Fukui

FOREIGN PATENT DOCUMENTS

| | | |
|---|---|---|
| CN | 101566281 | 10/2009 |
| JP | 4241756 | 3/2009 |
| JP | 2009-140718 | 6/2009 |
| JP | 2009167358 | 7/2009 |
| KR | 10-2004-0093686 | 11/2004 |
| KR | 10-0705739 | 4/2007 |
| KR | 10-0763557 | 10/2007 |

OTHER PUBLICATIONS

Chinese Office Action issued Jan. 6, 2015, in Chinese Application No. 201280006747.7.

LED MODULE AND LIGHTING ASSEMBLY

CROSS-REFERENCE TO RELATED APPLICATIONS

This application is the National Stage entry of International Application PCT/KR2012/000381, filed on Jan. 17, 2012, and claims priority from and the benefit of Korean Patent Application No. 10-2011-0007582, filed on Jan. 26, 2011, which are incorporated herein by reference for all purposes as if fully set forth herein.

BACKGROUND

1. Field

The present invention relates to a light emitting diode (LED) module and a lighting assembly, and more particularly, to an LED module and a lighting assembly, which employ a driver integrated circuit device.

2. Background

Light emitting diode (LED) lighting assemblies have been used in place of conventional incandescent bulbs and fluorescent lamps. An LED lighting assembly generally comprises an LED module having an LED mounted on a printed circuit board (PCB), a driver circuit unit for driving the LED, and a heat sink for dissipating heat generated from the LED.

The conventional driver circuit unit comprises an electrolytic capacitor for lowering a relatively high voltage such as household AC power to a voltage required for driving the LED, a converter for converting AC power into DC power, and the like. The electrolytic capacitor or the converter is individually mounted on the PCB together with the LED or is assembled in the lighting assembly by being spaced apart from the PCB. However, since the electrolytic capacitor or the converter has a relatively shorter lifespan than the LED, the electrolytic capacitor or the converter has influence on the lifespan of the lighting assembly, and causes a power loss due to the voltage drop.

A driver integrated circuit device having a driver circuit integrated in a single chip or package has been developed so as to solve the problem of the driver circuit unit.

FIG. 1 is a sectional view schematically showing a lighting assembly comprising a driver integrated circuit.

Referring to FIG. 1, the lighting assembly comprises a heat sink 11, a PCB 13, a light emitting device 15 and a driver integrated circuit device 17.

The light emitting device 15 and the driver integrated circuit 17 are mounted on a same surface of the PCB 13, and are electrically connected to each other through a wire in the PCB. Accordingly, when the lighting assembly is connected to an external power source, the light emitting device 15 is driven by a driver circuit of the driver integrated circuit device 17.

Meanwhile, the heat sink 11 is disposed on a bottom surface of the PCB 13 so as to dissipate heat generated from the light emitting device 15. A metal PCB, a metal core PCB or the like may be used as the PCB 13 so that the heat generated from the light emitting device 15 is well transferred to the heat sink 11.

As the driver integrated circuit device 17 is employed, the assembling process of the lighting assembly is simplified, and consequently, the cost is decreased. Further, as the heat sink 11 is employed, it is possible to prevent the light emitting device 15 and the driver integrated circuit device 17 from being damaged by heat.

However, when the light emitting device is used in the lighting assembly, a relatively high optical power is required, and therefore, a considerable amount of heat is generated from the light emitting device. As a result, a relatively large-sized heat sink 11 is required to dissipate the heat generated from the light emitting device. Accordingly, the size of the lighting assembly is relatively increased, and the manufacturing cost of the lighting assembly is increased.

Meanwhile, if the size of the heat sink 11 is decreased, the heat dissipation performance of the heat sink 11 is decreased. As a result, while the lighting assembly is used, the temperature of the PCB 13 is relatively increased, and therefore, the heat may be transferred from the PCB 13 to the driver integrated circuit device 17. Accordingly, the temperature of the driver integrated circuit device 17 is increased, and therefore, a malfunction of the driver integrated circuit 17 may be caused. Further, the driver integrated circuit device 17 is damaged by heat, and therefore, the lifespan of the lighting assembly may be decreased.

SUMMARY

An object of the present invention is to provide an LED module and a lighting assembly, which can block the thermal interference between a light emitting device and a driver integrated circuit.

Another object of the present invention is to provide an LED module and a lighting assembly, which can prevent a malfunction or damage of a driver integrated circuit device from being caused by heat and relatively decrease the size of a heat sink.

According to an aspect of the present invention, there is provided an LED lighting assembly. The lighting assembly comprises a light emitting device; a driver integrated circuit device for driving the light emitting device; a heat sink for dissipating heat generated from the light emitting device; and a heat shielding portion for blocking the thermal interference between the driver integrated circuit device and the light emitting device. In the lighting assembly, the driver integrated circuit device is disposed on the heat shielding portion.

As the driver integrated circuit device is disposed on the heat shielding portion, the driver integrated circuit device and the light emitting device can be thermally separated from each other. Further, as the heat shielding portion is employed, it is possible to prevent the driver integrated circuit device from being erroneously operated or damaged by heat generated from the light emitting device. Thus, the size of the heat sink can be relatively decreased.

The heat shielding portion may be disposed between the heat sink and the driver integrated circuit device. Thus, the driver integrated circuit device can be thermally separated from the heat sink.

Meanwhile, the lighting assembly may further comprise a PCB positioned on the heat sink. The light emitting device and the driver integrated circuit device may be mounted on the PCB, and the heat shielding portion may be disposed between the PCB and the driver integrated circuit device.

In some embodiments, the lighting assembly may further comprise a heat transfer portion for allowing the heat generated from the light emitting device to be transferred to the heat sink. The heat transfer portion may be connected to the heat sink through a via hole of the PCB. Accordingly, the heat generated from the light emitting device can be directly transferred to the heat sink.

The driver integrated circuit device may be a chip having a driver circuit integrated thereon or a package having the chip mounted therein. Also, the light emitting device may be an LED chip or an LED package having the LED chip mounted therein. Further, although the LED chip may have a single light emitting element, the present invention is not limited thereto, and therefore the LED chip may be a high-voltage LED chip having two or more light emitting elements, which is turned on at a high voltage of 6V or more.

The driver integrated circuit device is supplied with AC or DC power so as to drive the light emitting device. Particularly, when the driver integrated circuit device is supplied with the AC power so as to drive the light emitting device, it is possible to provide a lighting assembly capable of being used by being directly connected to an AC power source such as a general household power source.

The heat shielding portion may be formed of a material having a thermal conductivity lower than that of the PCB. For example, the heat shielding portion may be formed of a plastic heat insulator, a polymer resin containing an inorganic substance, or a ceramic heat insulator. The heat shielding portion may be formed of, for example, a plastic heat insulator such as urethane foam or vinyl chloride foam, or a ceramic heat insulator such as bubble glass.

In some embodiments, the heat shielding portion may comprise an upper portion at a side of the driver integrated circuit device, a lower portion opposite to the upper portion, and a middle portion between the upper portion and the lower portion, the middle portion having a width narrower than those of the upper and lower portions. The heat transfer can be further prevented by employing the middle portion.

According to another aspect of the present invention, there is provided an LED module. The LED module comprises a PCB; a light emitting device mounted on the PCB; a driver integrated circuit device mounted on the PCB; and a heat shielding portion disposed between the driver integrated circuit device and the PCB.

According to the present invention, it is possible to provide an LED module and a lighting assembly, which can block the thermal interference between a driver integrated circuit device and a light emitting device. Accordingly, it is possible to prevent the driver integrated circuit device from being erroneously operated or damaged by heat and to relatively decrease the size of a heat sink for dissipating heat generated from the light emitting device. As a result, it is possible to decrease the size of the lighting assembly.

DETAILED DESCRIPTION OF THE ILLUSTRATED EMBODIMENTS

Figure 1:
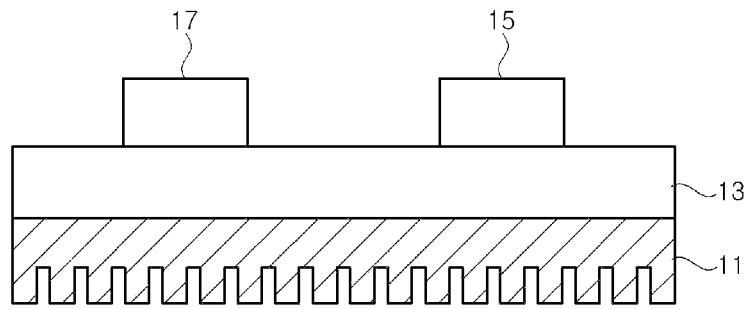
FIG. 1 is a schematic sectional view illustrating an LED lighting assembly according to a related art.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 2:
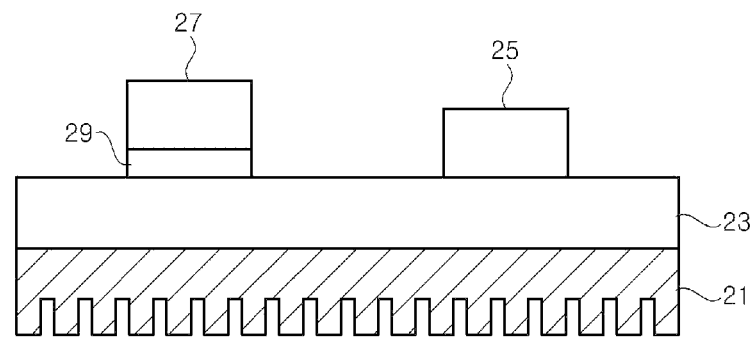
FIG. 2 is a schematic sectional view illustrating an LED lighting assembly according to an embodiment of the present invention.

FIG. 2 is a schematic sectional view illustrating an LED lighting assembly according to an embodiment of the present invention.

Referring to FIG. 2, the lighting assembly according to this embodiment comprises a heat sink 21, a PCB 23, a light emitting device 25, a driver integrated circuit device 27 and a heat shielding portion 29. Here, the PCB 23, the light emitting device 25, the driver integrated circuit device 27 and the heat shielding portion 29 constitute an LED module.

The heat sink 21 is used to dissipate heat generated during driving of the lighting assembly, and particularly to dissipate heat generated from the light emitting device 25. The heat sink 21 may be formed of a metal having a high dissipation property, e.g., aluminum or aluminum alloy, but the present invention is not limited thereto. The heat sink 21 may have a concavo-convex pattern so as to increase the surface area thereof. The heat sink 21 may have various shapes corresponding to the shape and structure of the lighting assembly.

The PCB 23 is disposed on the heat sink 21. The PCB 23 may be a conventional PCB such as a FR4 PCB, a metal PCB or a metal core PCB. Particularly, the metal PCB or the metal core PCB allows the heat generated from the light emitting device 25 to be well transferred the heat sink 21. The PCB 23 comprises a wire pattern (not shown) through which the driver integrated circuit device 27 and the light emitting device 25 can be electrically connected to each other.

The light emitting device 25 comprises an LED chip, and may be a chip level light emitting device or a package level light emitting device. That is, an LED package having the LED chip mounted therein may be mounted on the PCB 23, however, the present invention is not limited thereto, and the LED chip may be directly mounted on the PCB 23 like a chip-on-board (COB) type. When the LED chip is directly mounted on the PCB 23, the heat generated from the LED chip can be more easily dissipated.

Although the LED chip may comprise a GaN-based LED chip, the present invention is not limited thereto, and the LED chip may comprise a GaP-based LED chip. Although the LED chip may have a single diode, i.e., a single light emitting element, the present invention is not limited thereto, and the LED chip may be a high-voltage LED chip having two or more light emitting elements, which can be driven at a high voltage of, for example, 6V or more.

Although only one light emitting device 25 has been illustrated in this embodiment, a plurality of light emitting devices 25 may be mounted on the PCB 23, and may be connected in series and/or in parallel. Accordingly, it is possible to provide a lighting assembly capable of being directly driven at household AC power which corresponds to 110 or 220V.

The driver integrated circuit device 27 is mounted on the PCB 23. The driver integrated circuit device 27 may be electrically connected to the light emitting device 25 through the wire pattern of the PCB 23. The driver integrated circuit device 27 may be a chip level driver integrated circuit device or a package level driver integrated circuit device. That is, the driver integrated circuit device 27 may be a chip having a driver circuit integrated on a single substrate or a package having the chip mounted therein. The driver integrated circuit device 27 may be supplied with DC or AC power so as to drive the light emitting device 25. Particularly, when the driver integrated circuit device 27 is supplied with AC power supplied from an AC power source so as to drive the light emitting device 25, it is possible to provide a lighting assembly which may be used by being directly connected to the AC power source such as a general household power source.

Meanwhile, the heat shielding portion 29 is positioned between the PCB 23 and the driver integrated circuit device 27 so that the driver integrated circuit device 27 is thermally separated from the PCB 23. Accordingly, it is possible to block the thermal interference between the light emitting device 25 and the driver integrated circuit device 27.

The heat shielding portion 29 is not particularly limited as long as it is made of a material having a thermal conductivity lower than that of the PCB 23. For example, the heat shielding portion may be formed of a plastic heat insulator, a polymer resin containing an inorganic substance, or a ceramic heat insulator. The heat shielding portion may be formed, for example, using plastic foam such as urethane foam or ceramic such as bubble glass.

The driver integrated circuit device 27 is mounted on the heat shielding portion 29. When the driver integrated circuit device 27 is the chip level driver integrated circuit device, the driver integrated circuit device 27 may be electrically connected to the wire pattern of the PCB 23 through bonding wires. When the driver integrated circuit device 27 is the package level driver integrated circuit device, electrical contact portions, i.e., leads, of the driver integrated circuit device 27 may be connected to metal pads (not shown) on the heat shielding portion 29, and the metal pads may be electrically connected to the wire pattern of the PCB 23 through the bonding wires. Alternatively, the leads of the driver integrated circuit device 27 may be directly connected to the wire pattern of the PCB 23.

As the heat shielding portion 29 is employed, it is possible to prevent the heat generated from the light emitting device 25 from being transferred to the driver integrated circuit device 27 through the PCB 23, and thus it is possible to prevent the driver integrated circuit device 27 from being erroneously operated or damaged by the heat. As a result, the size of the heat sink 21 can be relatively decreased, thereby decreasing the size of the lighting assembly.

Figure 3:
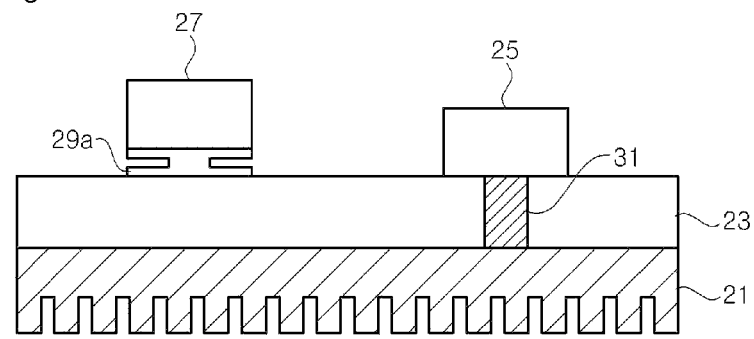
FIG. 3 is a schematic sectional view illustrating an LED lighting assembly according to another embodiment of the present invention.

FIG. 3 is a schematic sectional view illustrating an LED lighting assembly according to another embodiment of the present invention.

Referring to FIG. 3, like the lighting assembly described with reference to FIG. 2, the lighting assembly according to this embodiment comprises a heat sink 21, a PCB 23, a light emitting device 25 and a driver integrated circuit device 27. However, the lighting assembly according to this embodiment further comprises a heat transfer portion 31, and a heat shielding portion 29a the shape of which is different from that of the heat shielding portion of FIG. 2.

The heat transfer portion 31 may be connected to the heat sink 21 through a via hole of the PCB 23, and the light emitting device 25 is mounted on the heat transfer portion 31. The heat transfer portion 31 allows the heat generated from the light emitting device 25 to be directly transferred to the heat sink 21, and thus it is possible to reduce an increase in temperature of the PCB 23. The heat transfer portion 31 may be formed of a metal paste filled in the via hole of the PCB 23 or a plating layer formed on an inner wall of the via hole.

Although only one heat transfer portion 31 has been illustrated in this embodiment, the present invention is not limited thereto, and therefore a plurality of heat transfer portions 31 corresponding to a plurality of light emitting devices 25 may be formed in via holes of the PCB 23, respectively. Further, a plurality of small via holes may be formed corresponding to the plurality of light emitting devices 25, respectively.

Meanwhile, the heat shielding portion 29a comprises an upper portion at a side of the driver integrated circuit device 27, a lower portion opposite to the upper portion, and a middle portion between the upper and lower portions, which has a width narrower than those of the upper and lower portions. The lower portion is disposed on the PCB 23. Since the heat shielding portion 29a has the middle portion having a relatively narrow width, the inflow and/or outflow of heat through the heat shielding portion 29a can be further prevented, so that the driver integrated circuit device 27 can be more effectively separated thermally from the PCB.

The heat shielding portion 29a of this embodiment is not limited thereto, and therefore may be employed in all the embodiments. Further, the heat transfer portion 31 may be applied to all the embodiments using the PCB 23.

Figure 4:
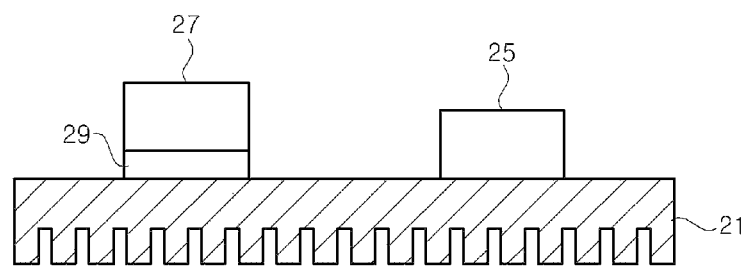
FIG. 4 is a schematic sectional view illustrating an LED lighting assembly according to another embodiment of the present invention.

FIG. 4 is a schematic sectional view illustrating an LED lighting assembly according to another embodiment of the present invention.

Referring to FIG. 4, the lighting assembly according to this embodiment comprising a heat sink 21, a light emitting device 25, a driver integrated circuit 27 and a heat shielding portion 29 is similar to the previous embodiments except that the PCB 23 is omitted.

That is, the light emitting device 25 and the driver integrated circuit device 27 are mounted on the heat sink 21 without the PCB 23. The heat shielding portion 29 is disposed between the driver integrated circuit device 27 and the heat sink 21 so that the driver integrated circuit device 27 is thermally separated from the heat sink 21.

Meanwhile, the heat sink 21 may comprise a wire pattern (now shown) formed on a top surface thereof. When the heat sink 21 is made of a metal, the wire pattern may be insulated from the metallic heat sink 21 by an insulating layer.

The light emitting device 25 is mounted on the heat sink 21, and is electrically connected to the wire pattern. A bottom surface of the light emitting device 25 may come in direct contact with the heat sink 21, and thus the heat generated from the light emitting device 25 can be directly dissipated to the heat sink 21.

Further, the driver integrated circuit device 27 may be thermally and electrically separated from the heat sink 21 by the heat shielding portion 29, and may be electrically connected to a metal pattern on the heat sink 21 through a bonding wire or the like.

According to this embodiment, since the PCB is omitted, the heat generated from the light emitting device 25 can be more rapidly dissipated to the heat sink 21, thereby improving dissipation efficiency.

The present invention is not limited to the aforementioned embodiments but may be implemented into different forms. That is, these embodiments are provided only for illustrative purposes and for full understanding of the scope of the present invention by those skilled in the art. Further, the scope of the present invention should be understood within the scope of the present invention defined by the appended claims.

The invention claimed is:

1. A light emitting diode (LED) lighting assembly, comprising:
   a heat sink;
   a printed circuit board (PCB) comprising a wire pattern, wherein the PCB is disposed on the heat sink;
   a light emitting device disposed on the heat sink and mounted on the PCB;
   a driver integrated circuit device disposed on the heat sink; and
   a heat shielding portion disposed between the PCB and the driver integrated circuit device,
   wherein the driver integrated circuit device is a chip level driver integrated circuit device that comprises a bond wire that connects the driver integrated circuit device to the wire pattern of the PCB, and wherein the heat shielding portion is configured to block thermal interference between the driver integrated circuit device and the light emitting device.

2. The LED lighting assembly of claim 1, further comprising a heat transfer portion connected to the heat sink through a via hole in the PCB, wherein the heat transfer portion is configured to transfer heat generated from the light emitting device to the heat sink.

3. The LED lighting assembly of claim 1, wherein the light emitting device comprises an LED chip, or an LED package comprising the LED chip mounted therein.

4. The LED lighting assembly of claim 3, wherein the LED chip is configured to be turned on at a voltage of 6V or more.

5. The LED lighting assembly of claim 1, wherein the driver integrated circuit device is configured to be supplied with AC power to drive the light emitting device.

6. The LED lighting assembly of claim 1, wherein the heat shielding portion comprises a material having a lower thermal conductivity than that of the PCB.

7. The LED lighting assembly of claim 6, wherein the heat shielding portion comprises a plastic heat insulator, a polymer resin comprising an inorganic substance, or a ceramic heat insulator.

8. The LED lighting assembly of claim 6, wherein the heat shielding portion comprises an upper portion contacting a side of the driver integrated circuit device, a lower portion opposite to the upper portion, and a middle portion between the upper and lower portions, the middle portion having a smaller width than the widths of the upper and lower portions, respectively.

9. An LED module, comprising:
- a heat sink;
- a printed circuit board (PCB) comprising a wire pattern, wherein the PCB is disposed on the heat sink;
- a light emitting device disposed on the heat sink and mounted on the PCB;
- a driver integrated circuit device disposed on the heat sink; and
- a heat shielding portion disposed between the PCB and the driver integrated circuit device,
- wherein the driver integrated circuit device is a chip level driver integrated circuit device that comprises a bond wire that connects the driver integrated circuit device to the wire pattern of the PCB.

10. The LED module of claim 9, further comprising a heat transfer portion passing through the PCB, wherein the light emitting device is disposed on the heat transfer portion.

11. The LED module of claim 10, wherein the light emitting device comprises an LED chip or an LED package comprising the LED chip mounted therein.

12. The LED module of claim 11, wherein the LED chip is configured to be turned on at a voltage of 6V or more.

13. The LED module of claim 9, wherein the driver integrated circuit device is configured to be supplied with AC power to drive the light emitting device.

14. The LED module of claim 9, wherein the heat shielding portion comprises a material having a lower thermal conductivity than that of the PCB.

15. The LED module of claim 14, wherein the heat shielding portion comprises a plastic heat insulator, a polymer resin comprising an inorganic substance, or a ceramic heat insulator.

16. The LED module of claim 14, wherein the heat shielding portion comprises an upper portion contacting a side of the driver integrated circuit device, a opposing lower portion, and a middle portion disposed between the upper and lower portions, the middle portion having a smaller width than the widths of the upper and lower portions, respectively.

17. The LED module of claim 9, wherein:
- the light emitting device and the driver integrated circuit device are mounted on the PCB; and
- the heat shielding portion is disposed between the PCB and the driver integrated circuit device.

18. A light emitting diode (LED) lighting assembly, comprising:
- a heat sink;
- a printed circuit board (PCB) comprising a wire pattern, wherein the PCB is disposed on the heat sink;
- a light emitting device disposed on the heat sink and mounted on the PCB;
- a driver integrated circuit device disposed on the heat sink; and
- a heat shielding portion comprising a metal pad and a bond wire, wherein the heat shielding portion is disposed between the PCB and the driver integrated circuit device,
- wherein the driver integrated circuit device is a package level driver integrated circuit device that comprises a lead that connects to the metal pad of the heat shield portion,
- wherein the metal pad connects to the wire pattern through the bond wire, and
- wherein the heat shielding portion is configured to block thermal interference between the driver integrated circuit device and the light emitting device.

* * * * *